United States Patent [19]

Osaki et al.

[11] Patent Number: 5,326,665
[45] Date of Patent: Jul. 5, 1994

[54] POSITIVE TYPE RESIST COMPOSITION

[75] Inventors: Haruyoshi Osaki, Toyonaka; Hiroshi Moriuma, Nara; Yasunori Uetani, Toyonaka, all of Japan

[73] Assignee: Sumitomo Chemical Company, Limited, Osaka, Japan

[21] Appl. No.: 24,499

[22] Filed: Mar. 1, 1993

[30] Foreign Application Priority Data

Mar. 5, 1992 [JP] Japan .................................. 4-048438

[51] Int. Cl.$^5$ ........................ G03F 7/023; G03F 7/30
[52] U.S. Cl. ......................... 430/192; 430/165; 430/191; 430/193; 528/153; 528/155; 528/157
[58] Field of Search ............... 430/165, 191, 192, 193; 528/153, 155, 157

[56] References Cited

U.S. PATENT DOCUMENTS

| | | | |
|---|---|---|---|
| 4,731,319 | 3/1988 | Kohara et al. | 430/193 |
| 5,019,479 | 5/1991 | Oka et al. | 430/165 |
| 5,077,173 | 12/1991 | Schultz et al. | 430/193 |
| 5,177,172 | 1/1993 | Toukhy | 430/192 |
| 5,188,920 | 2/1993 | Moriuma et al. | 430/192 |
| 5,200,293 | 4/1993 | Schultz et al. | 430/192 |

FOREIGN PATENT DOCUMENTS

| | | | |
|---|---|---|---|
| 358871A3 | 3/1990 | European Pat. Off. | |
| 358871A2 | 3/1990 | European Pat. Off. | |
| 415266A2 | 8/1990 | European Pat. Off. | |
| 461654A2 | 6/1991 | European Pat. Off. | |
| 496640 | 7/1992 | European Pat. Off. | 430/192 |
| 2272457 | 2/1990 | Japan. | |
| 3-200254 | 9/1991 | Japan | 430/192 |

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive type resist composition comprising an alkali-soluble resin and a quinonediazide compound, wherein the alkali-soluble resin containing resin (A) is obtainable through a condensation reaction with at least one phenol compound represented by the following general formula (I):

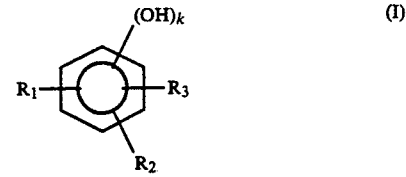

wherein $R_1$ to $R_3$ independently of one another each represent a hydrogen atom or an alkyl or alkoxy group having 1-4 carbon atoms and k represents 1 or 2, at least one compound represented by the following general formula (II):

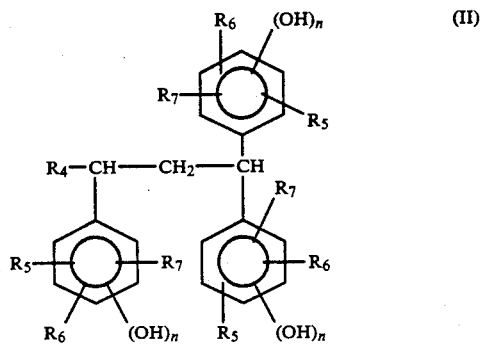

wherein $R_4$ represents a hydrogen atom, an alkyl group having 1-4 carbon atoms or a phenyl group, $R_5$ to $R_7$ independently of one another each represent a hydrogen atom or an alkyl or alkoxy group having 1-4 carbon atoms and n represents 1 or 2, and an aldehyde compound. This composition is excellent in the balance between performances such as sensitivity, heat resistance and profile, and is free from scum.

20 Claims, No Drawings

POSITIVE TYPE RESIST COMPOSITION

BACKGROUND OF THE INVENTION

1. Field of the Invention

This invention relates to a positive type resist composition suitable for use as a positive type photoresist sensitive to radiations such as ultraviolet rays including g ray and i ray, far ultraviolet rays including excimer laser and the like, electron beams, ion beams, X ray and the like.

2. Related Art

Compositions comprising a quinonediazide compound and an alkali-soluble resin are used as positive type photoresists, because their quinonediazide groups decompose when irradiated by a light having a wavelength of 500 nm or shorter and, as its result, they change from an alkali-insoluble material to an alkalisoluble material. Since these positive type photoresists are much superior to negative type ones in resolution, they are used for the preparation of integrated circuits such as IC, LSI, etc.

In the current integrated circuits, the improvement in the degree of integration has brought about a decrease in the width of wiring, due to which the hitherto employed wet etching process is being replaced by the dry etching process. Dry etching process is accompanied by an elevation of the substrate temperature, which can result in a deformation of resist pattern and a drop in dimensional accuracy. Thus, at the present time, an improvement of the heat resistance of resist is demanded more earnestly than ever. Further, if a scum remains after the development or the profile is not rectangular, undesirable influences are exercised on the dimension of substrate after dry etching, so that a resist free from scum and giving a good profile is requested. However, if a good pattern profile and a high resolution are aimed at simultaneously, the sensitivity is greatly deteriorated usually. From such a viewpoint, the positive type photoresists today in use cannot be said to be satisfactory in the balance between performances such as sensitivity, profile, scum and heat resistance.

SUMMARY OF THE INVENTION

This invention provides a positive type resist composition excellent in the balance between performances such as sensitivity, profile and heat resistance and free from scum.

This invention relates to a positive type resist composition comprising an alkali-soluble resin and a quinonediazide compound, wherein the alkalisoluble resin containing resin (A) is obtainable through a condensation reaction with at least one phenol compound represented by general formula (I):

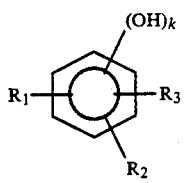

wherein $R_1$ to $R_3$ independently of one another each represent a hydrogen atom or an alkyl or alkoxy group having 1–4 carbon atoms and k represents 1 or 2, at least one compound represented by general formula (II):

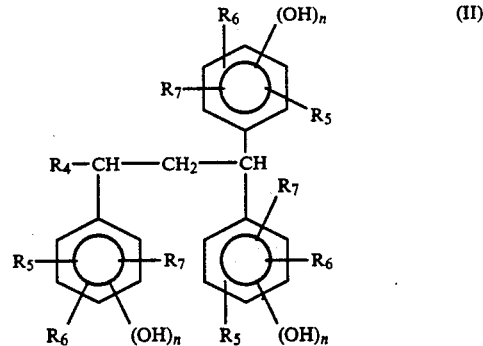

wherein $R_4$ represents a hydrogen atom, an alkyl group having 1–4 carbon atoms or a phenyl group, $R_5$ to $R_7$ independently of one another each represent a hydrogen atom or an alkyl or alkoxy group having 1–4 carbon atoms and n represents 1 or 2, and an aldehyde compound.

DETAILED DESCRIPTION OF THE INVENTION

Examples of the phenol compound represented by general formula (I) include phenol, o-cresol, m-cresol, p-cresol, 3,5-xylenol, 2,5-xylenol, 2,3-xylenol, 3,4-xylenol, 2,3,5-trimethylphenol, 4-tert-butylphenol, 2-tert-butylphenol, 3-tert-butylphenol, 2-tert-butyl-4-methylphenol, 2-tert-butyl-5-methylphenol, 2-methylresorcinol, 4-methylresorcinol, 5-methylresorcinol, 4-tert-butylcatechol, 4-methoxyphenol, 3-methoxyphenol, 2-methoxyphenol, 2-methoxycatechol, 2-methoxyresorcinol, 3-methoxyresorcinol, 2,3-dimethoxyphenol, 2,5-dimethoxyphenol, 3,5-dimethoxyphenol, 3-ethylphenol, 2-ethylphenol, 2-ethylphenol, 4-ethylphenol, 2,3,5-triethylphenol, 3,5-diethylphenol, 2,5-diethylphenol and the like. Among them, m-cresol, p-cresol, 3,5-xylenol, 2,5-xylenol, 2,3,5-trimethylphenol and 2-tert-butyl-5-methylphenol are preferable.

The phenol compounds are used either singly or in the form of a mixture of two or more members. Concrete examples of the mixture include mixtures of m-cresol and p-cresol; m-cresol and 3,5-xylenol; m-cresol and 2,3,5-trimethylphenol; m-cresol and 2-tert-butyl-5-methylphenol; m-cresol, p-cresol and 3,5-xylenol; m-cresol, p-cresol and 2,3,5-trimethylphenol; m-cresol, p-cresol and 2-tert-butyl-5-methylphenol; and the like.

The mixing ratio at the time of mixing of two or more phenol compounds may be decided appropriately.

As the alkyl groups represented by $R_4$ to $R_7$ in general formula (II), straight chain and branched chain alkyl groups can be used, among which methyl, ethyl and tert-butyl are preferable.

Among the compounds represented by general formula (II), preferable are those represented by the following formula :

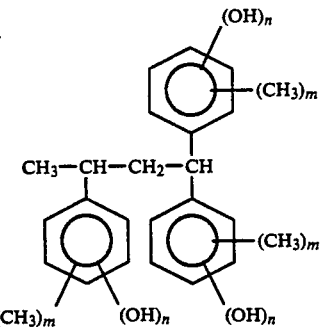

wherein m is 0, 1, 2 or 3 and n is 1 or 2, among which the compound represented by the following formula is particularly preferred:

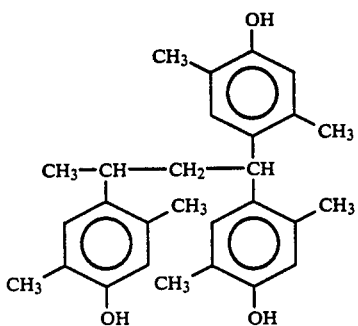

The molar ratio between the phenol compound represented by general formula (I) and the compound represented by general formula (II) is preferably in the range of 60:40 to 99.5: 0.5.

The compounds represented by general formula (II) can be produced by reacting the corresponding phenol compound with an aldehyde compound represented by the following general formula (V):

wherein $R_4$ represents a hydrogen atom, an alkyl group having 1-4 carbon atoms or a phenyl group, in the presence of an acid catalyst.

Examples of the aldehyde to be subjected to a condensation reaction with the phenol compound represented by general formula (I) and the compound represented by general formula (II) include formaldehyde, acetaldehyde, propionaldehyde, n-butyraldehyde, iso-butyraldehyde, trimethylacetaldehyde, n-hexyl aidehyde, acrolein, crotonaldehyde, cyclohexane aidehyde, cyclopentane aidehyde, furfural, furylacrolein, benzaldehyde, o-tolualdehyde, p-tolualdehyde, m-tolualdehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, phenylacetaldehyde, o-hydroxybenzaldehyde, p-hydroxybenzaldehyde, m-hydroxybenzaldehyde, cinnamaldehyde, o-anisaldehyde, p-anisaldehyde, m-anisaldehyde, vanillin and the like.

These aldehydes are used either singly or in the form of a mixture of two or more members. Among these aldehydes, formaldehyde is preferable because of its industrial availability.

The aldehyde is used preferably in an amount of 0.35-2 moles per mole of the sum of the phenol compound represented by the formula (I) and the compound represented by the formula (II).

As the acid catalyst used in the condensation reaction, inorganic acids such as hydrochloric acid, sulfuric acid, perchloric acid, phosphoric acid and the like, organic acids such as formic acid, acetic acid, oxalic acid, trichloroacetic acid, p-toluenesulfonic acid and the like, and divalent metal salts such as zinc acetate, zinc chloride, magnesium acetate and the like can be referred to. These acid catalysts are used either singly or in the form of a mixture of two or more meters. The acid catalyst is preferably used in an amount of 0.005-2 moles per mole of the sum of the phenol compound represented by the formula (I) and the compound represented by the formula (II).

The condensation reaction is usually carried out at 60°-250° C. for 2-30 hours. In carrying out the reaction, a phenol compound represented by the general formula (I), a compound represented by the general formula (II), an aldehyde and an acid catalyst are charged either at once or portionwise. The condensation reaction is carried out either in bulk or in a solvent. The solvents which can be used include, for example, water, alcohols such as methanol, ethanol, iso-propanol, n-butanol, iso-amyl alcohol and the like; ketones such as methyl isobutyl ketone, methyl ethyl ketone, cyclohexanone, and the like; hydrocarbons such as hexane, heptane, cyclohexane, benzene, toluene, xylene and the like; and methyl cellosolve, ethyl cellosolve, ethyl cellosolve acetate and the like. Usually, these solvents are used in an amount of 10-1,000 parts by weight per 100 parts by weight of the sum of the phenol compound represented by the general formula (I) and the compound represented by the general formula (II).

As the resin (A), those in which, as expressed in terms of the GPC (using UV-254 nm detector, hereinafter the same) pattern area, the ratio of the component having a polystyrene-converted molecular weight of 1,000 or below to the total resin (A) from which the unreacted phenol compound is excepted is not greater than 30% are preferable, and those simultaneously satisfying the above condition and another condition that, as expressed by GPC pattern area, the ratio of the component having a polystyrene-converted molecular weight of 6,000 or below to the total resin (A) from which the unreacted phenol compound is excepted is not smaller than 15% and not greater than 65% are more preferable, from the viewpoint of improvement in heat resistance and prevention from scum formation. Such resins can easily be obtained by conducting fractionation or the like after the condensation reaction. The fractionation is carried out by a method which comprises dissolving a resin produced by the condensation reaction in a good solvent such as alcohols (methanol, ethanol or the like), ketones (acetone, methyl ethyl ketone, methyl isobutyl ketone or the like), ethylene glycol or its ethers or ether-esters (ethyl cellosolve acetate or the like), tetrahydrofuran or the like, followed by pouring the resulting solution into water to precipitate the resin or by pouring the solution into a solvent such as pentane, hexane, heptane, cyclohexane or the like and recovering the resin from separated two liquid layers.

As resin (A), those of which polystyrene-converted weight average molecular weight measured from its GPC pattern is in the range of 2,000-20,000 are preferable.

As preferable examples of the alkali-soluble resin, those containing both resin (A) and a low molecular weight novolac resin (B) having a polystyrene-converted weight average molecular weight of 200-2,000 as measured by GPC can be referred to.

As more preferable examples of the alkali-soluble resin, those simultaneously satisfying the above-mentioned condition and another condition that, as expressed in terms of GPC pattern area, the ratio of the component having a polystyrene-converted molecular weight of 1,000 or below to the total resin (A) from which the unreacted phenol compound is excepted is 30% or less can be referred to. As particularly preferable examples of the alkali-soluble resin, those simultaneously satisfying the above-mentioned condition and another condition that, as expressed in terms of GPC pattern area, the ratio of the component having a molecular weight of 6,000 or below to the total resin (A) from which the unreacted phenol compound is excepted is not smaller than 15% and not greater than 65% can be referred to.

The low molecular weight novolac resin (B) can be produced by reacting a phenol compound with an aidehyde such as formaldehyde, paraformaldehyde, actealdehyde, glyoxal or the like in the presence of an acid catalyst. Examples of said phenol compound include phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, resorcinol and the like. These phenol compounds may be used either singly or in the form of a mixture of two or members, while giving consideration to the solubility in the alkali developing solution. Among the phenol compounds mentioned above, o-cresol, m-cresol and p-cresol are preferable.

As the acid catalyst, the same inorganic acids, organic acids and divalent metal salts as have been mentioned above can be used. The reaction temperature is 30°-250° C., and the other reaction conditions are similar to those in the above-mentioned condensation reaction.

More preferably, the low molecular weight novolac resin (B) has a molecular weight (polystyreneconverted weight average molecular weight) of 200-1,000. If the molecular weight exceeds 2,000, the positive type photoresist lowers its sensitivity. If the molecular weight is lower than 200, its adhesiveness to substrate and its heat resistance are deteriorated.

The molecular weight of the low molecular weight novolac resin (B) can easily be regulated by changing the molar ratio of the aldehyde to the phenol compound. A low molecular weight novolac resin (B) having a molecular weight of 200-2,000 can be produced, for example in the case of a m-cresol/formaldehyde resin, by effecting the reaction at a preset molar ratio [formaldehyde/m-cresol] of 0.65 to 0.05. After the reaction, the residual monomer is preferably removed by distillation or the like.

The content of the low molecular weight novolac resin (B) in the alkali-soluble resin is preferably 4-50 parts by weight per 100 parts by weight of the total alkali-soluble resin. If the content of the low molecular weight novolac resin (B) is lower than 4 parts by weight, the solubility in alkali developing solution is deteriorated. If its content exceeds 50 parts by weight, the areas not irradiated by radiations become readily soluble in alkali developing solution, which makes the patterning work difficult to carry out.

Preferably, the positive type resist composition of this invention comprises, in addition to the quinonediazide compound and the alkali-soluble resin containing resin (A), a compound represented by the following general formula (III) as an additive:

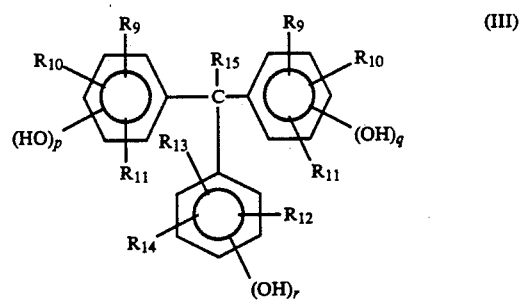

wherein $R_9$ to $R_{14}$ independently of one another each represent a hydrogen atom or an alkyl or alkoxy group having 1-4 carbon atoms, $R_{15}$ represents a hydrogen atom, an alkyl group having 1-4 carbon atoms or an aryl group, and p, q and r each represent 0, 1 or 2.

In general formula (III), the alkyl and alkoxy groups represented by $R_9$ to $R_{14}$ include those of straight and branched chain forms. As preferable members of the alkyl or alkoxy group, methyl, ethyl, methoxy and ethoxy groups can be referred to. As the aryl group represented by $R_{15}$, substituted and unsubstituted aryl groups can be referred to. Preferable examples of the substituent include alkyl groups and hydroxyl group.

Preferable examples of the compound of general formula (III) include the following:

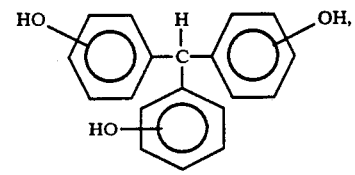

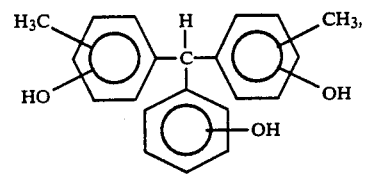

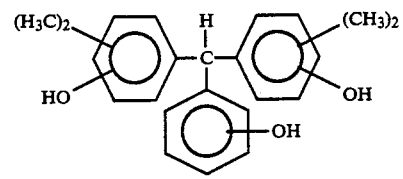

and its particularly preferable examples include the following:

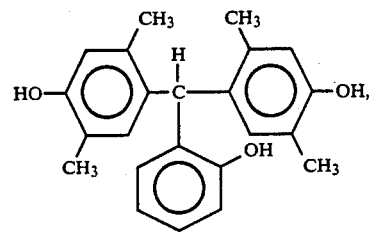

-continued

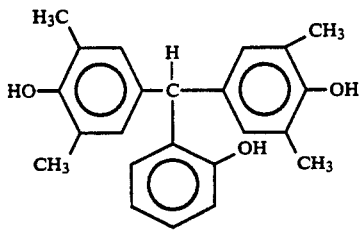

The compound represented by general formula (III) can be produced, for example, by a method similar to that mentioned in Japanese Patent Application KOKAI No. 2-275955. An amount of the compound represented by the general formula (III) is 4–40 parts by weight per 100 parts by weight of the total amount of the alkali-soluble resin.

Into the alkali-soluble resin, an alkali-soluble other resin or compound may be incorporated in addition to the above-mentioned resin (A) and low molecular weight novolac resin (B), unless the effect of this invention is deteriorated thereby. Examples of said "other resin or compound" include novolac resins other than the resin (A) and the low molecular weight novolac resin (B), and polyvinylphenol and the like.

Examples of said "novolac resins other than resin (A) and resin (B)" include the resins prepared by condensing a phenol compound such as phenol, o-cresol, m-cresol, p-cresol, 2,5-xylenol, 3,4-xylenol, 2,3,5-trimethylphenol, 4-tert-butylphenol, 2-tert-butylphenol, 3-tert-butylphenol, 2-tert-butyl-5-methylphenol, 3-ethylphenol, 2-ethylphenol, 4-ethylphenol, 2-naphthol, 1,3-dihydroxynaphthalene, 1,5-dihydroxynaphthalene, 1,7-dihydroxynaphthalene and the like either singly or in combination of two or more members with formaldehyde in the usual way.

The quinonediazide compound is not critical, and its examples include 1,2-benzoquinonediazide-4-sulfonic esters, 1,2-naphthoquinonediazide-4-sulfonic esters, 1,2-naphthoquinonediazide-5-sulfonic esters and the like. These quinonediazide compounds can be prepared, for example, by condensing benzoquinone-diazide-sulfonic acid or 1,2-naphthoquninonediazide-sulfonic acid with a compound having a hydroxyl group in the presence of a weak alkali.

Examples of said compound having a hydroxyl group include hydroquinone; resorcin; phloroglucin; 2,4-dihydroxybenzophenone; trihydroxybenzophenones such as 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone and the like; tetrahydroxybenzophenones such as 2,3,3',4-tetrahydroxy-benzophenone, 2,3,4,4'-tetrahydroxybenzophenone, 2,2',4,4'-tetrahydroxybenzophenone, 2,2',3,4-tetra-hydroxybenzophenone, 2,2',3,4'-tetrahydroxybenzophenone, 2,2',5,5'-tetrahydroxybenzophenone, 2,3',4',5-tetra-hydroxybenzophenone, 2,3',5,5'-tetrahydroxybenzophenone and the like; pentahydroxybenzophenones such as 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone and the like; hexahydroxybenzophenones such as 2,3,3',4,4',5'-hexahydroxybenzophenone, 2,2',3,3',4,5'-hexahydroxybenzophenone and the like; alkyl esters of gallic acid; the oxyflavans mentioned in Japanese Patent Application KOKAI No. 2-84650 as general formula (I); the phenol compounds mentioned in Japanese Patent Application KOKAI No. 2-269351 as general formula (I); the phenol compounds mentioned in Japanese Patent Application KOKAI No. 3-49437 as general formula (I); and the phenol compounds represented by the following general formula (IV):

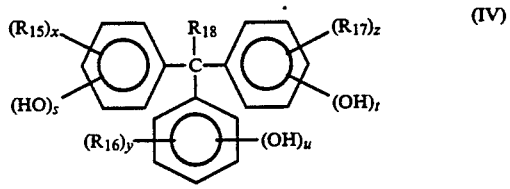

wherein $R_{15}$ to $R_{18}$ independently of one another each represent a hydrogen atom or an alkyl, alkenyl, alkoxy or aryl group; s, t and u each represent 0, 1, 2, 3 or 4, provided that $s+t+u$ is 2 or greater, and x, y and z each represent 0, 1, 2, 3 or 4.

Particularly preferable quinonediazide compounds include the compounds mentioned in Japanese Patent Application KOKAI No. 2-84650 as general formula (I) and the condensation products formed between a compound represented by general formula (IV) and 1,2-naphthoquinonediazide-5-sulfonic acid wherein the number of ester groups in said condensation products is 2 or greater per molecule on the average.

The quinonediazide compounds are used either singly or in the form of a mixture of two or more members. The amount of the quinonediazide compound is usually 5–50% by weight and preferably 10–40% by weight based on the total weight of the alkali-soluble resin, or when a compound of general formula (III) is added as an additive, based on the sun, ned weight of said compound and the alkali-soluble resin.

As the solvent used in the preparation of a positive type photoresist solution, those having an appropriate drying speed and capable of vaporizing to leave behind a uniform and smooth coating film are preferred. As such solvents, glycol ether esters such as ethyl cellosolve acetate, propylene glycol monomethyl ether acetate and the like and the solvents mentioned in Japanese Patent Application KOKAI No. 2-220056, as well as ethyl pyruvate, n-amyl acetate, ethyl lactate, 2-heptanone, γ-butyrolactone and the like, can be referred to. These solvents can be used either singly or in the form of a mixture of two or more members. Although the amount of the solvent is not critical so far as a coating film uniform in quality and free from pin-hole and unevenness can be formed on a wafer, a positive type photoresist solution is usually prepared so that the concentration of solid component including quinonediazide compound, alkali-soluble resin and the like in the resist solution comes to 3–50% by weight.

If desired, a sensitizer, other resin, a surfactant, a stabilizer, a dye and the like may be added to the positive type photoresist solution.

The positive type resist composition of this invention is excellent in the balance between performances such as sensitivity, heat resistance, profile, etc. and is free from scum.

Next, this invention is explained more concretely by referring to the following examples. The invention is by no means limited by these examples. In the examples, parts are by weight.

Synthesis Example 1

Into a mixture of 347.3 g of 2,5-xylenol, 300 g of methyl alcohol and 28.5 g of p-toluenesulfonic acid was dropwise added 66.4 g of crotonaldehyde at 65° C. over a period of one hour with stirring. After completion of the dropping, the resulting mixture was reacted at 65°-75° C. for 5 hours. After cooling the mixture to room temperature, 300 g of deionized water was added thereto over a period of 10 minutes and stirred for a while. The resulting crystalline precipitate was collected by filtration, washed with 500 ml of 1/1 mixture of methyl alcohol and deionized water, and dried to obtain a compound represented by the following formula (b):

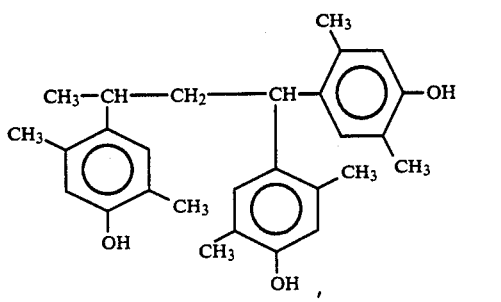

Synthesis Example 2

Into a mixture of 129.8 g of m-cresol, 86.5 g of p-cresol, 41.9 g of the compound of formula (b) obtained in Synthesis Example 1, 75.7 g of 90% acetic acid, 44.3 g of 10% oxalic acid aq. solution and 266.3 g of methyl isobutyl ketone, was dropwise added 104.0 g of 37% fomalin at 80° C. over a period of 60 minutes with stirring. Then, the resulting mixture was stirred at the same temperature for 14 hours. Then, the mixture was washed with water and dehydrated to obtain a solution of a novolac resin in methyl isobutyl ketone. As measured by GPC, the polystyrene-converted weight average molecular weight of the resin was 4,770.

Referential Example 1

A mixture of 203 g of the solution of novolac resin in methyl isobutyl ketone obtained above (novolac resin content 39.6%), 392.3 g of methyl isobutyl ketone and 456.8 g of n-heptane was stirred at 60° C. for 30 minutes, and thereafter it was allowed to stand and separated into two layers. Then, 122 g of 2-heptanone was added to the lower layer, and the resulting mixture was concentrated by means of an evaporator to prepare a solution of a novolac resin in 2-heptanone.

As measured by GPC, the polystyrene-converted weight average molecular weight of the resin was 9,580. In the GPC pattern, the ratio of the pattern area of the component having a polystyrene-converted molecular weight of 6,000 or below to the total pattern area from which the pattern area of the unreacted phenol compound was excepted was 38.8%, and the ratio of the pattern area of the component having a polystyrene-converted molecular weight of 1,000 or below to the total pattern area from which the pattern area of the unreacted phenol compound was excepted was 9.0%.

Referential Example 2

A solution of a novolac resin in methyl isobutyl ketone was prepared by carrying out a reaction, washing the reaction product with water and drying the product in the same manner as in Synthesis Example 2, except that the compound of formula (b) was not used and the amounts of m-cresol and p-cresol were altered both to 135 g. As measured by GPC, the polystyrene-converted weight average molecular weight of the product was 4,550.

A mixture of 100 g of the solution of novolac resin in methyl isobutyl ketone obtained above (novolac resin content 40%), 188.7 g of methyl isobutyl ketone and 199.4 g of n-heptane was stirred at 60° C. for 30 minutes, allowed to stand and separated into two layers. To the lower layer was added 120 g of 2-heptanone, and the resulting mixture was concentrated by means of an evaporator to obtain a solution of novolac resin in 2-heptanone.

As measured by GPC, the resin had a polystyrene-converted weight average molecular weight of 9,540. In its GPC pattern, the ratio of the pattern area of the component having a polystyrene-converted molecular weight of 6,000 or below to the total pattern area from which the area of the unreacted phenol compound was excepted was 37.5%, and the ratio of the pattern area of the component having a polystyrene-converted molecular weight of 1,000 or below to the total pattern area from which the area of unreacted phenol compound was excepted was 18.1%.

Example 1 and Comparative Example 1

Each of the novolac resins obtained in Referential Examples 1 and 2, a compound represented by the following formula (a):

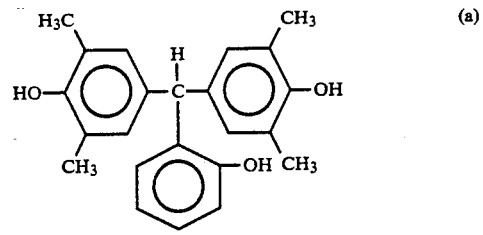

and a quinonediazide compound (photosensitizer) were dissolved in 2-heptanone according to the formulation shown in the following table, provided that the amounts of the solvents were controlled so as to give a coating film of 1,055 μm in thickness under the coating conditions mentioned below, and the solutions thus obtained were filtered through a Teflon filter having a pore size of 0.2 μm to prepare resist solutions. Each resist solution was coated onto a silicon wafer having been washed in the usual way by the use of a rotary coater at 4,000 r.p.m. Subsequently, the silicon wafer was baked for one minute on a vacuum adsorption type hot plate at 90° C. Then, the wafer was exposed to light by means of a reduced projection type exposing apparatus (Nikon NSR1755i 7A) using a super-high pressure mercury lamp as a light source, while changing the time of exposure from a shot to another shot. Then, the exposed wafer was developed with Alkaline Developer SOPD (manufactured by Sumitomo Chemical Co.,Ltd.) to obtain a positive type pattern.

Then, the cross section of 0.4 μm line-and-space space (L/S) was visually examined by means of SEM (scanning electron microscope) to measure the exposure time giving a 1:1 line-and-space at the best focus, from which the sensitivity was determined. A film thickness retention was calculated from a remaining film thickness in the unexposed part. Further, the silicon wafer carrying the developed resist pattern was allowed to stand for 30 minutes in an atmosphere of air in a clean oven preset to various temperatures, and thereafter the resist pattern was visually examined by means of SEM to evaluate the heat resistance. The results are summarized in the following table. It is apparent from the table that the positive type resist composition of this invention is excellent in the balance between performances such as profile, heat resistance, sensitivity, etc., and is free from scum.

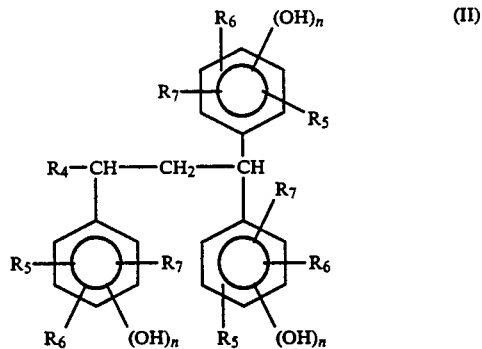

wherein $R_4$ represents a hydrogen atom, an alkyl group having 1–4 carbon atoms or a phenyl group, $R_5$ to $R_7$ independently of ne another each represent a hydrogen atom or an alkyl or alkoxy group having 1–4 carbon

TABLE 1

| No. | Resin (Referential Example No.) | Compound (a) | Sensitizer | Sensitivity (msec) *2 | Film thickness retention (%) | Resolution (μm) | Heat resistance (°C.) *3 | Profile *4 | Scum *5 |
|---|---|---|---|---|---|---|---|---|---|
| Example 1 | (1) 10.43 | 3.9 | c *1 2.7 | 169 | 100 | 0.35 | 165 | ⊓ | ○ |
| Comparative Example 1 | (2) 10.43 | 3.9 | c *1 2.7 | 158 | 100 | 0.40 | 160 | ⌒ | Δ |

*1 c is a quinonediazide compound prepared by condensation reaction of the following compound:

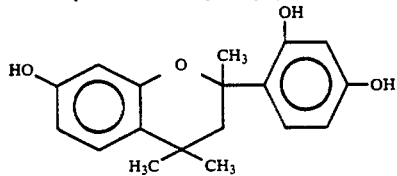

and naphthoquinone-(1,2)-diazido-(2)-5-sulfonic acid chloride, wherein 2.8 hydroxyl groups per molecule are esterified on the average.
*2 A value at which 0.4 μm L/S shows the first break-off at a ratio of 1:1.
*3 The inner temperature of clean oven at which a resist pattern begins to show a sagging.
*4 Profile in 0.4 μm L/S.
*5 Scum in 0.4 μm L/S, wherein ○ means "good" and Δ means "medium".

What is claimed is:

1. A positive type resist composition comprising in admixture an alkali-soluble resin and a quinonediazide compound, wherein the alkali-soluble resin containing resin (A) is obtainable through a condensation reaction with at least one phenol compound represented by the following general formula (I):

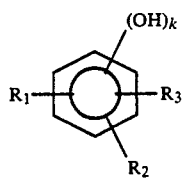

wherein $R_1$ to $R_3$ independently of one another each represent a hydrogen atom or an alkyl or alkoxy group having 1–4 carbon atoms and k represents 1 or 2, at least one compound represented by the following general formula (II):

atoms and n represents 1 or 2, and an aldehyde compound.

2. A positive type resist composition according to claim 1, wherein the compound represented by the general formula (II) is a compound of the following formula:

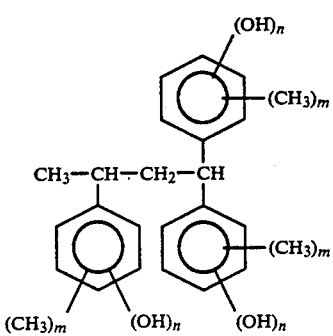

wherein m is 0, 1, 2 or 3 and n is 1 or 2.

3. A positive type resist composition according to claim 1, wherein the compound represented by the general formula (II) is a compound of the following formula:

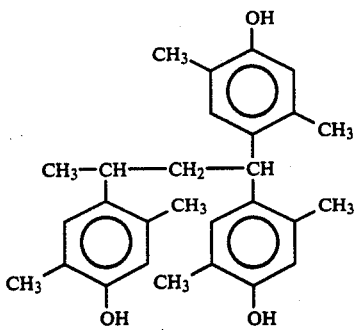

4. A positive type resist composition according to claim 1, wherein the phenol compound represented by the general formula (I) is m-cresol, p-cresol, 3,5-xylenol, 2,5-xylenol, 2,3,5-trimethylphenol or 2-tert-butyl-5-methylphenol.

5. A positive type resist composition according to claim 1, wherein the molar ratio of the phenol compound represented by the general formula (I) to the compound represented by the general formula (II) in the condensation reaction is in the range of 60:40 to 99.5:0.5.

6. A positive type resist composition according to claim 1, wherein, as expressed in terms of GPC pattern area, the ratio of the component having a polystyrene-converted molecular weight of 1,000 or below to the total resin (A) from which the unreacted phenol compound is excepted is 30% or less.

7. A positive type resist composition according to claim 6, wherein, as expressed in terms of GPC pattern area, the ratio of the component having a polystyrene-converted molecular weight of 6,000 or below to the total resin (A) from which the unreacted phenol compound is excepted is not smaller than 15% and not greater than 65%.

8. A positive type resist composition according to claim 1, wherein, as measured from GPC pattern, the polystyrene-converted weight average molecular weight of resin (A) is 2,000 to 20,000.

9. A positive type resist composition according to claim 1, wherein the alkali-soluble resin additionally contains a low molecular weight novolac resin (B) having a polystyrene-converted weight average molecular weight of 200 to 2,000 as measured by GPC.

10. A positive type resist composition according to claim 9, wherein the low molecular weight novolac resin (B) is a cresol novolac resin.

11. A positive type resist composition according to claim 9, wherein the low molecular weight novolac resin (B) has a polystyrene-converted weight average molecular weight of 200 to 1,000 as measured by GPC.

12. A positive type resist composition according to claim 9, wherein the content of the low molecular weight novolac resin (B) is 4 to 50 parts by weight per 100 parts by weight of the total amount of the alkali-soluble resin.

13. A positive type resist composition according to claim 1, which contains, in addition to the alkali-soluble resin and the quinonediazide compound, a compound represented by the following general formula (III):

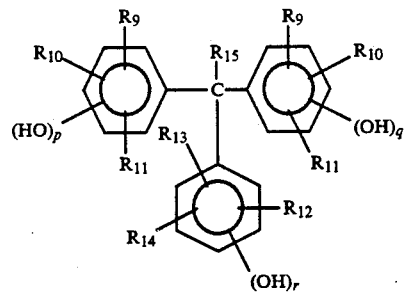

wherein $R_9$ to $R_{14}$ independently of one another each represent a hydrogen atom or an alkyl or alkoxy group having 1–4 carbon atoms, $R_{15}$ represents a hydrogen atom, an alkyl group having 1–4 carbon atoms or an aryl group, and p, q and r each represent 0, 1 or 2.

14. A positive type resist composition according to claim 13, wherein the compound represented by the general formula (III) is one of the compounds represented by the following formulas:

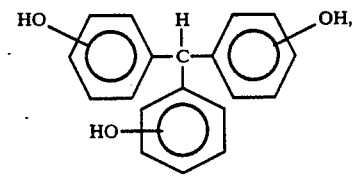

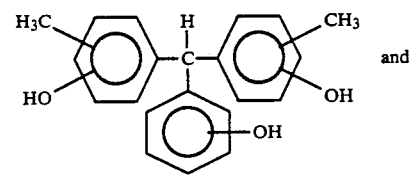

and

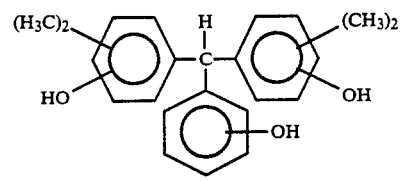

15. A positive type resist composition according to claim 13, wherein the compound represented by the general formula (III) is a compound represented by one of the following formulas:

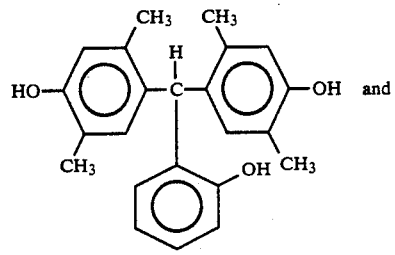

and

-continued

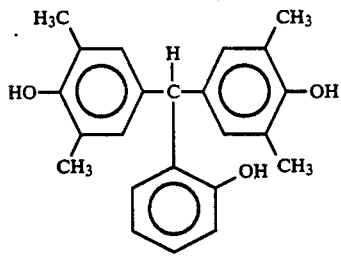

16. A positive type resist composition according to claim 13, wherein the content of the compound represented by the general formula (III) is 4 to 40 parts by weight per 100 parts by weight of the total amount of the alkali-soluble resin.

17. A positive type resist composition according to claim 2, wherein the phenol compound represented by the general formula (I) is m-cresol, p-cresol, 3,5-xylenol, 2,5-xylenol, 2,3,5-trimethylphenol or 2-tert-butyl-5-methylphenol.

18. A positive type resist composition according to claim 17, wherein the compound represented by the general formula (II) is a compound of the following formula

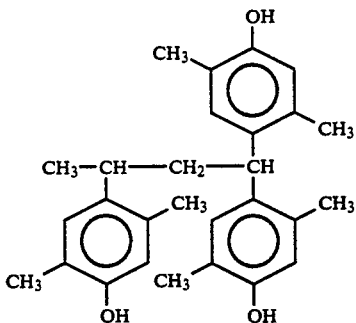

19. A positive type resist composition according to claim 17, wherein the molar ratio of the phenol compound represented by the general formula (I) to the compound represented by the general formula (II) in the condensation reaction is in the range of 60:40 to 99.5:0.5.

20. A positive type resist composition according to claim 19, wherein, as expressed in terms of GPC pattern area, the ratio of the component having a polystyrene-converted molecular weight of 1,000 or below to the total resin (A) from which the unreacted phenol compound is excepted is 30% or less.

* * * * *